United States Patent [19]

Chi

[11] Patent Number: 4,954,825

[45] Date of Patent: Sep. 4, 1990

[54] SELF CLOCKING BINARY DATA ENCODING/DECODING METHOD

[75] Inventor: Chao S. Chi, San Diego, Calif.

[73] Assignee: Eastman Kodak Company, Rochester, N.J.

[21] Appl. No.: 327,073

[22] Filed: Mar. 22, 1989

[51] Int. Cl.$^5$ ............................................. H03M 5/06
[52] U.S. Cl. ........................................ 341/64; 341/52; 360/44
[58] Field of Search ................. 341/50, 52, 53, 54, 341/55, 63, 64, 67, 68, 69, 70, 71, 72, 73, 74; 360/40, 44, 48, 51; 375/20, 21, 110

[56] References Cited

U.S. PATENT DOCUMENTS

| | | | |
|---|---|---|---|
| 3,967,062 | 6/1976 | Dobias | 341/71 |
| 4,060,837 | 12/1977 | Rynearson | 360/44 |

*Primary Examiner*—William M. Shoop, Jr.
*Assistant Examiner*—Howard L. Williams
*Attorney, Agent, or Firm*—Francis H. Boos

[57] ABSTRACT

A method for modulating binary data into a format suitable for encoding and decoding information, that employs a non-return-to-zero (NRZ) technique. The modulating method includes: defining within a recording medium an event-cell as the time between two adjacent clock transitions having a similar, unique characteristic; and, selectively writing to the recording medium within the event-cell, at an arbitrary time, either a first or a second information. The selective writing step includes generating a first event and a corresponding first read signal in response to a first information and generating a second event and a corresponding second read signal in response to the second information. The method can be employed for a first situation where the information transfer rate during the modulating process is well-regulated, and is advantageously employed for a second situation where the information transfer rate is dependent on unpredictable and variable transfer rate velocities and accelerations.

14 Claims, 3 Drawing Sheets

SELF CLOCKING BINARY DATA ENCODING/DECODING METHOD

This application is related to application Ser. No. 206,407 filed June 14, 1988, by Wash; to application Ser. No. 206,408 filed June 14, 1988 by Whitfield et al.; to application Ser. No. 206,553 filed June 14, 1988, by Whitfield; to application Ser. No. 206,646 filed June 14, 1988 by Wash; to application Ser. No. 327,071 filed on Mar. 22, 1989, by A. Whitfield, which is being filed contemporaneously with this application; and to application Ser. No. 327,068 filed on Mar. 22, 1989 by F. Silva, which is being filed contemporaneously with this application. The entire disclosures of each of these applications are incorporated by reference herein. Each of these applications is copending and commonly assigned.

FIELD OF THE INVENTION

This invention relates to a method for modulating binary data into a format suitable for encoding and decoding information.

INTRODUCTION TO THE INVENTION

Methods for encoding and decoding binary data or information extend to such disparate fields as e.g., magnetic systems or optical systems. The methods include the step of storing a binary 0 or 1 on a small area of material or medium. Storage is dynamic, for the medium on which the information is recorded typically moves past a reading or writing device, or vice versa. Typically, in writing information on a medium surface, the binary information is supplied to a recording circuitry, which then codes this information into a pattern which is recorded by a writing device. The techniques which are used to write information on the medium include the two well-known categories: the return-to-zero (RZ) technique, and the non-return-to-zero (NRZ) techniques. Useful methods for reading information using either technique also vary and are well known. Reference may be made, for example, to the Handbook authored by Jorgensen entitled THE COMPLETE HANDBOOK OF MAGNETIC RECORDING, (1980) published by Tab Books Inc., Blue Ridge Summit, PA.

The process for encoding and decoding binary information is not straightforward, and considerable attention has been given to both the recording patterns used to represent data 0 to 1 bits, and the means for determining the value recorded. Clearly, the reading and writing procedures should be as reliable as is possible.

SUMMARY OF THE INVENTION

As indicated above, the process for encoding and decoding binary information typically is dynamic, for the medium on which the information is recorded may move past a reading or writing device, or vice versa. The stated objective of reliability has been realized for this situation in systems where the information transfer rate is well-regulated e.g., disk drive, optical disk, or streaming tape. Here, the decoded information bits can be precisely positioned in a time opening known as a data window. If a bit is present in the data window, the decoded bit is a 1. If no bit is present in the data window, the bit is a zero.

In sharp contrast to this situation in which the information transfer rate is well regulated, is that situation where the information transfer rate is not, or cannot be, well-controlled i.e., the transfer rate is dependent on unpredictable and variable transfer rate velocities and accelerations. For example, magnetic credit card readers fit into this last situation. Here, the prior art encoding and decoding techniques may require the employment of expensive, multiple writing and/or reading devices, fail or cease to provide a desired reliability, or be limited to a very low storage or information capacity.

I have now discovered a novel method for modulating binary information or data into a format suitable for encoding and decoding binary information. The novel method fits into the non-return-to-zero (NRZ) techniques which are used to write information on a medium. The medium can be, for example, a magnetic medium or an optical medium. The novel method can be employed for the first situation where the information transfer rate is well-regulated. It is particularly advantageously employed, as well, for the second situation, where the information transfer rate may be dependent on unpredictable and variable transfer rate velocities and accelerations. The novel method has an advantage of requiring the employment of only one writing or reading device, including the case of a very high storage or information capacity, thus considerably reducing the expense of the presently required multiple reading and writing devices. The novel method has a further advantage of having a bi-directional capability, as well as a uni-directional capability. At the same time, the novel method realizes the stated objective of reliability.

Accordingly, the present invention provides a method for modulating binary data comprising first and second information, the method comprising:
(1) defining an event-cell as the time between two adjacent clock transitions, the clock transitions having a unique characteristic; and
(2) selectively writing the information into the event-cell at an arbitrary time, by
   (i) generating a first event and a corresponding first read signal, in response to the first information; or
   (ii) generating a second event and a corresponding second read signal, in response to the second information.

BRIEF DESCRIPTION OF THE DRAWING

The present invention is illustrated in the accompanying drawing, in which.

DETAILED DESCRIPTION OF THE INVENTION

Figure 1:
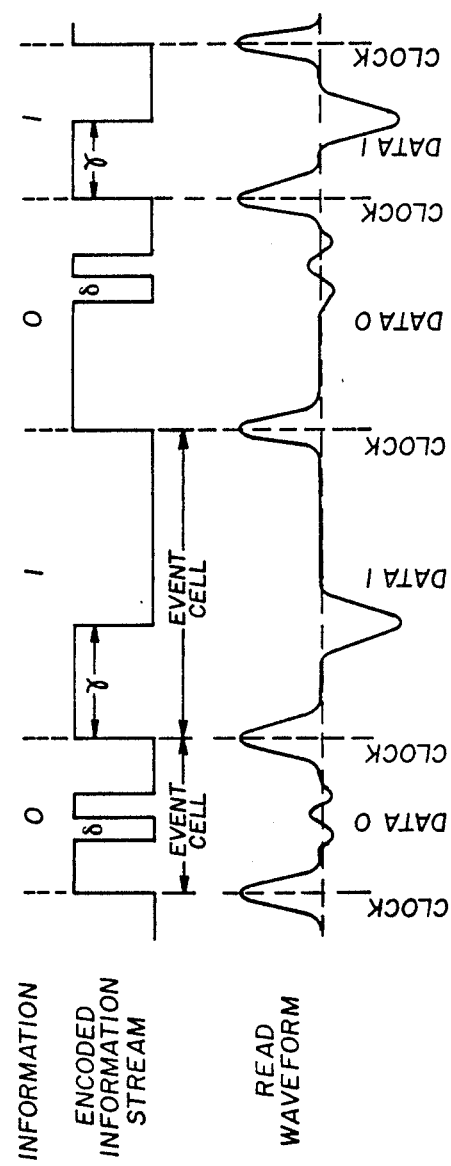
FIGS. 1–4 show waveforms that explain different embodiments of the present invention.

As summarized above, the present method comprises defining an event-cell as the time between two adjacent clock transitions, the clock transitions having a unique characteristic. For example, a unique characteristic for an event-cell comprising a magnetic capability may be that of polarity, so that e.g., the clock transitions are always a positive polarity. On the other hand, for an event-cell comprising an optical capability, the unique characteristic may be that of color, so that a clock transition may be uniquely assigned a light-to-dark transition, or vice versa.

The cited requirement, that the clock transitions have a unique characteristic, helps to explain why the present method may be employed when the information transfer rate or modulation process may be dependent on unpredictable and variable transfer rate velocities and accelerations. This follows because the clock transitions as defined can provide self-clocking and velocity insensitive writing, i.e., the self-clocking refers to an absolute, self-contained timing reference.

For example, consider the case of a succession of event-cells. In the general case, the time $t_1$ between two adjacent clock transitions of a first event-cell, may differ from the time $t_2$ between two adjacent clock transitions of a second event-cell. This is a consequence of the information transfer rate being dependent on the unpredictable and variable transfer rate velocities and accelerations. It should be clear, therefore, that if one employed an external, invariant clocking mechanism to indicate the advent of an event-cell, it would shortly be out of synchronization with the variable time dependent event-cell succession. The present method, in sharp contrast, overcomes this problem by way of its self-clocking capability, i.e., the unique clock transitions define an initiation and a conclusion of the event-cell, no matter when an event-cell occurs, and, at the same time, the unique clock transitions are distinguished from the information. As a consequence, the present method does not have a phase-margin limitation.

Looked at another way, the present method, since it can provide a self-clocking capability, can eliminate a prior-art need for such compensating mechanisms as phase-locked loop hardware, to simulate self-clocking, or the dedication of (wasteful) overhead information assigned to preamble, synchronization marks, etc., as surrogates for a self-clocking capability. Moreover, the present method provides the step of writing information at any arbitrary time within an event-cell. This means that the window for writing an information is virtually 100%, which translates downstream into optimum read signal direction.

I now turn to preferred aspects of the present method.

The first and second events preferably comprise different, selectively controlled information transitions which leave invariant the unique clock transition characteristic. Further, generating the first event, and the corresponding first read signal, defines a mathematical mapping which maps the first event (domain) to its image, namely, the first read signal (range); similarly, generating the second event, and the corresponding second read signal, defines a mathematical mapping which maps the second event (domain) to its image, namely, the second read signal (range). Since the first and second read signals are developed in order to qualitatively distinguish the first and second informations, suitable mathematical mappings insure the discrimination between the first and second informations. To this end, the mathematical mappings preferably are such that the range in the first read signal is a null set, and the range in the second read signal is a finite set (or vice versa). For example, a suitable mathematical mapping, for the case of a magnetic medium, is Faraday's Law which maps magnetic flux linkages (domain) to a voltage signal (range).

Note that when, for example, electronic circuitry is employed to realize this aspect of the method, the mathematical mappings may be of the form of electronic signals, so that first and second read signals correspond to first and second amplitudes, frequencies, or phases, and discrimination as to first and second read signals (information) may be realized by the first and second amplitudes, etc., being substantially different.

The event-cell preferably comprises a material having a magnetic capability, for example, a 35 gauss remanence tape ($H_C = 375$ Oe). For the magnetic event-cell, the step of writing the first information into the event-cell preferably comprises generating the first event comprising magnetic flux transitions, so controlled that they define a flux transfer rate whose derivative, in accordance with Faraday's Law, is substantially zero. In particular, the step of writing the first information into the event-cell can comprise generating the first even comprising at least three (or, if more than three, odd) magnetic flux pulse transitions, so controlled that the first corresponding read signal, defined as the change in the magnetic flux pulse transitions per unit of time, is substantially zero.

Similarly, the step of writing the second information into the magnetic event-cell preferably comprises generating the second event comprising magnetic flux transitions, so controlled that they define a flux transfer rate whose derivative, in accordance with Faraday's Law, is finite. In particular, the step or writing the second information into the magnetic event-cell can comprise generating the second event comprising a single flux pulse transition, so controlled that the second corresponding read signal, defined as the change in the magnetic flux pulse transition per unit of time, is non-zero.

Note, that in all cases, the first and second magnetic events have a two-fold function viz; they operate to provide discrimination of the first and second informations, and they leave invariant the unique clock transition characteristic, for example, an invariant positive polarity.

Attention is now directed to the Figures, which shows waveforms that help illustrate different embodiments of the present method. The FIG. 1 embodiment is one wherein an event-cell (E-C) comprises a material having a magnetic capability. The event-cell is defined as a variable interval (i.e., time or space) between two adjacent clock transitions, the clock transitions having a unique characteristic, namely, positive polarity.

It is an objective of the present method to selectively write an arbitrary information bit string [0 1 0 1] into successive event-cells. To this end, a first event is dedicated to writing an information 0; a second event is dedicated to writing an information 1. In particular, the first event comprises three magnetic flux pulse transitions, each pulse having a pulse width $\delta$, while the second event comprises a single magnetic flux pulse transitions, having a pulse width $\gamma$. Note that the first and second events ful-fill the two-fold function specified above. First, the events comprise different, selectively controlled information transitions for each of the two kinds of information bits 0 or 1, namely, three versus one magnetic flux pulse transition. Second, the first and second events each leave invariant the positive clock transition polarity (shown by inspection of FIG. 1).

As disclosed above, generating the first and second events can develop a corresponding first and second read signal. Here, the correspondence is effected by way of a mathematical mapping defined byFaraday's Equation:

Read signal (Range) $\alpha$ $$\frac{\text{the rate of change of the magnetic flux pulse transition(s)}}{\text{change in time per event-cell}} \text{ (domain)}$$

In terms of the language employed above, the first and second events (i.e., the three and the single magnetic flux pulses, respectively) are the domain or the input to the equation, while the range is the output of the equation, namely the first and second read signals, respectively.

Figure 2:
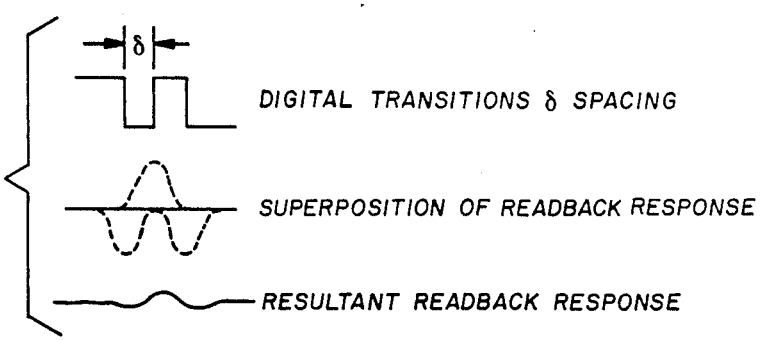

In order to distinguish the first and second read signals, to thereby re-capture the modulated information 1's and 0's, the pulse width $\delta$ of the three magnetic flux transitions (information 0) is so selected that, under the operation of Faraday's equation, the three magnetic pulse transitions effectively cancel out, as shown in FIG. 2. In other words, the read signal that corresponds to the first event (information 0), has zero amplitude. On the other hand, the pulse width $\gamma$ of the single magnetic pulse transition (information 1), is so selected that, under a similar operation of Faraday's equation, the change in the single magnetic flux pulse, per unit event-cell time, is substantially non-zero, i.e., the second read signal has an amplitude qualitatively different from the first read signal. (See FIG. 1).

Figure 3:
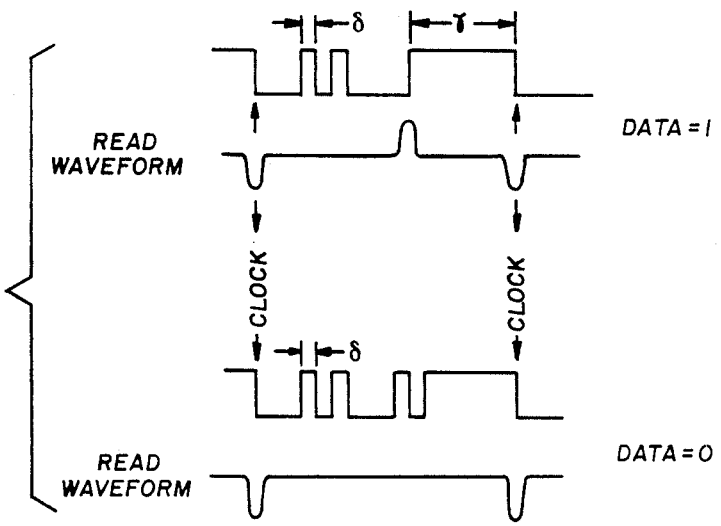

Attention is now directed to FIG. 3, which shows a new set of first and second events, defined in response to first and second informations (0's and 1's, respectively). The new events are substantially more complex than those described in FIG. 1 above, and are set forth here to emphasize that many different events can be conceptualized, and which fit into the required two-fold function specified above. That is, both of the FIG. 3 events insure that the clock transition polarity (here, negative) is left invariant by the events. And, they have a pulse width gap ($\delta$ and $\gamma$, respectively) that insures discrimination of the information under operation of Faraday's Equation. In particular, the $\delta$ sets of pulses cancel out, as in FIG. 2, above, so that in effect, the complex FIG. 3 arrangement may be understood to reduce to the canonical FIG. 1 embodiment.

Finally, preferred circuits that may be employed for realizing the encoding/decoding steps of the present method are disclosed in the application Ser. Nos. 327,071 and 327,068 cross-referenced above, and incorporated by reference herein.

EXAMPLE

Figure 4:
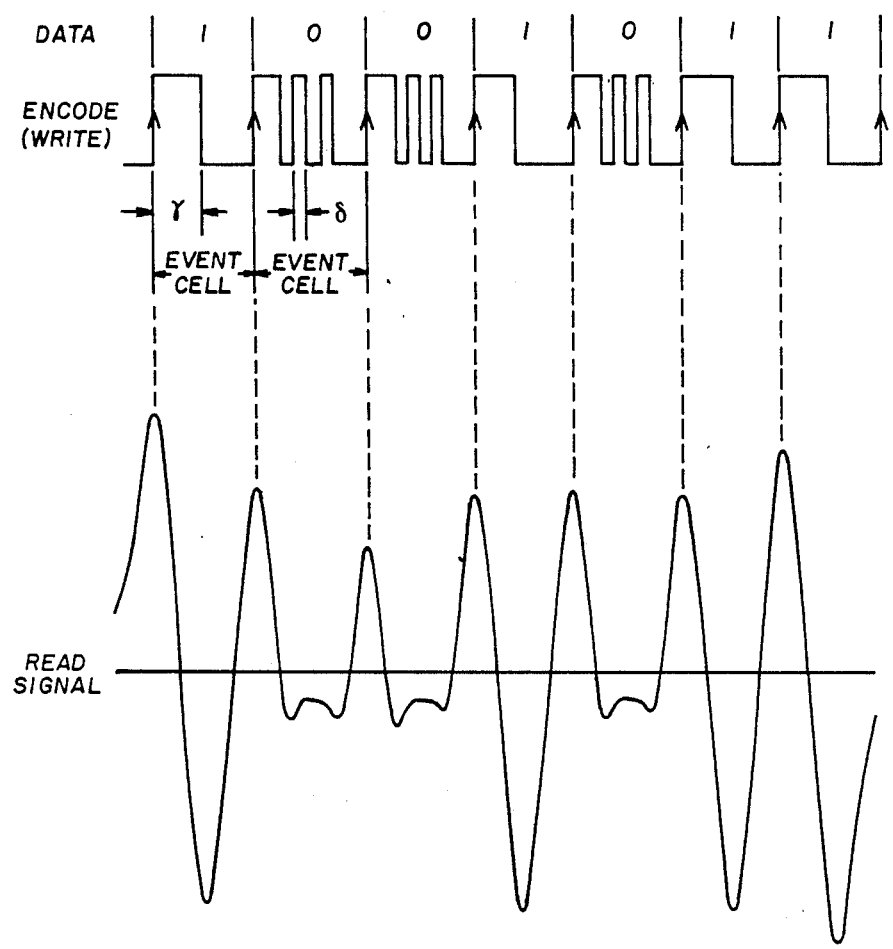

FIG. 4 illustrates an Example of the present method. The method was realized by way of a magnetic medium that comprised a 375 Oe. 35 Gauss remanence media, moving at 0.7 ips (inch per second), and with an information capability of 1300 event-cells per inch. An inductive writing/reading head was employed, the head having 1000 turns with a 120$\mu$ inch gap, 20 mils track width. In the FIG. 4 Example, an event-cell equalled 1000$\mu$ sec; $\gamma = 500\mu$ sec; $\delta = 125\mu$ sec.

The information bit string [1 0 0 1 0 1 1] was encoded according to the steps of the present method. Thus, the information 1 was encoded by generating a first event comprising a single information transition, width $\gamma = 500\mu$ sec; the information 0, on the other hand, was encoded by generating a second event comprising three alternate information transitions, with $\delta = 125\mu$ sec. Clock transitions were uniquely demarcated from the information transitions, and comprised a positive clock transition polarity.

The read signal shown in FIG. 4 demonstrated that the second event transitions had been so controlled by way of the $\delta$ parameter, that its corresponding read signal (i.e., the information 0) had a substantially zero magnitude; on the other hand, the first event transition had been so controlled, by way of the $\gamma$ parameter, that its corresponding read signal (i.e., the information 1), had a finite magnitude.

What is claimed is:
1. A method for modulating binary data comprising first and second information, the method comprising:
   (a) defining within a medium an event-cell as the time between two adjacent clock transitions, the clock transitions each having a similar, unique characteristic; and
   (b) selectively writing to the medium the information within the event-cell at an arbitrary time, by
      (i) generating a first transitional event and a corresponding first read signal, in response to the first information; or
      (ii) generating a second transitional event and a corresponding second read signal, in response to the second information; and
   (c) wherein said first transitional event and said second transitional event differ in the number of transitions per event-cell.

2. A method according to claim 1, wherein the first and second events leave invariant said unique clock transition characteristic.

3. A method according to claim 1, wherein the first and second events comprise different, selectively controlled information transitions for realizing clock transition polarity invariance.

4. A method according to claim 1, wherein
   (i) generating the first event and the corresponding first read signal defines a mathematical mapping which maps the first event (domain) to the first read signal (range); and
   (ii) the mapping is such that the range is a substantially zero set.

5. A method according to claim 1, wherein
   (i) generating the second event and the corresponding second read signal defines a mathematical mapping which maps the second event (domain) to the second read signal (range); and
   (ii) the mapping is such that the range is a non-zero set.

6. A method according to claim 1, wherein the first and second read signals have a first and second amplitude respectively, and the first amplitude is substantially different from the second amplitude.

7. A method according to claim 1, wherein the first and second read signals have a first and second phase respectively, and the first phase is substantially different from the second phase.

8. A method according to claim 1, wherein the first and second read signals have a first and second frequency respectively, and the first frequency is substantially different from the second frequency.

9. A method according to claim 1, wherein said step (a) includes defining the event-cell in a material having a magnetic capability.

10. A method according to claim 9, wherein the step of writing the first information into the event-cell comprises
    generating the first event comprising magnetic flux transitions, so controlled that they define a flux transfer rate whose derivative, in accordance with Faraday's Law, is substantially zero.

11. A method according to claim 10, wherein the step of writing the first information into the event-cell comprises generating the first event comprising at least three magnetic flux pulse transitions, so controlled that the first corresponding read signal, defined as the change in the magnetic flux pulse transitions per unit of time, is substantially zero.

12. A method according to claim 9, wherein the step of writing the second information into the event-cell comprises generating the second event comprising magnetic flux transitions, so controlled that they define a flux transfer rate whose derivative, in accordance with Faraday's Law, is non-zero.

13. A method according to claim 12, wherein the step of writing the second information into the event cell comprises generating the second event comprising a flux pulse transition, so controlled that the second corresponding read signal, defined as the change in the magnetic flux pulse transition per unit of time, is non-zero.

14. A method according to claim 1, in combination with a method for decoding the information in the event-cell, said decoding method including the step of detecting said first and second read signals.

* * * * *